US011910660B2

(12) United States Patent
Jia et al.

(10) Patent No.: US 11,910,660 B2
(45) Date of Patent: Feb. 20, 2024

(54) ORGANIC LIGHT-EMITTING DISPLAY SUBSTRATE AND MANUFACTURING METHOD THEREOF, AND ORGANIC LIGHT-EMITTING DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Li Jia, Beijing (CN); Tao Gao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 500 days.

(21) Appl. No.: 17/267,376

(22) PCT Filed: Apr. 29, 2020

(86) PCT No.: PCT/CN2020/087911
§ 371 (c)(1),
(2) Date: Feb. 9, 2021

(87) PCT Pub. No.: WO2021/217525
PCT Pub. Date: Nov. 4, 2021

(65) Prior Publication Data
US 2022/0115474 A1   Apr. 14, 2022

(51) Int. Cl.
| H01L 33/00 | (2010.01) |
| H10K 59/124 | (2023.01) |
| H10K 50/813 | (2023.01) |
| H10K 50/844 | (2023.01) |
| H10K 71/00 | (2023.01) |

(Continued)

(52) U.S. Cl.
CPC ......... *H10K 59/124* (2023.02); *H10K 50/813* (2023.02); *H10K 50/844* (2023.02);
(Continued)

(58) Field of Classification Search
None
See application file for complete search history.

(56) References Cited

U.S. PATENT DOCUMENTS

| 2012/0248465 A1 | 10/2012 | Choi et al. |
| 2017/0279079 A1 | 9/2017 | Kim et al. |

(Continued)

FOREIGN PATENT DOCUMENTS

| CN | 107230694 A | 10/2017 |
| CN | 107546245 A | 1/2018 |

(Continued)

OTHER PUBLICATIONS

Extended European Search Report dated May 12, 2023, relating to EP Patent Application No. 20897679.5.

*Primary Examiner* — Bradley Smith
(74) *Attorney, Agent, or Firm* — DINSMORE & SHOHL LLP

(57) ABSTRACT

Provided are an organic light-emitting display substrate and a manufacturing method thereof, and an organic light-emitting display device. A display area of the display substrate includes at least one opening. The display substrate includes a substrate, and an organic layer, a first inorganic layer, an anode layer and an organic functional layer that are sequentially arranged on one side of the substrate. The inorganic layer and the organic layer has at least one annular partition groove corresponding to each opening. A width of an orthographic projection of the notch of the annular partition groove on the substrate is smaller than that of an orthographic projection of the annular partition groove on (Continued)

the substrate. The functional layer includes a first organic functional material portion located outside the annular partition groove and a second organic functional material portion located inside the annular partition groove that are not connected.

20 Claims, 7 Drawing Sheets

(51) Int. Cl.
   *H10K 59/131* (2023.01)
   *H10K 59/12* (2023.01)
   *H10K 77/10* (2023.01)
   *H10K 102/00* (2023.01)

(52) U.S. Cl.
   CPC ......... *H10K 71/00* (2023.02); *H10K 59/1201* (2023.02); *H10K 59/131* (2023.02); *H10K 77/111* (2023.02); *H10K 2102/311* (2023.02)

(56) References Cited

U.S. PATENT DOCUMENTS

| | | |
|---|---|---|
| 2017/0373129 A1 | 12/2017 | Kim et al. |
| 2020/0006701 A1 | 1/2020 | Lee et al. |
| 2020/0073500 A1 | 3/2020 | Jeong et al. |
| 2020/0119304 A1* | 4/2020 | Choi et al. .......... H01L 51/5253 |
| 2021/0159446 A1 | 5/2021 | Xu et al. |

FOREIGN PATENT DOCUMENTS

| | | |
|---|---|---|
| CN | 110190104 A | 8/2019 |
| CN | 110429118 A | 11/2019 |
| CN | 110634928 A | 12/2019 |
| CN | 110660826 A | 1/2020 |
| CN | 110867475 A | 3/2020 |
| CN | 110875365 A | 3/2020 |
| KR | 20180036320 | 4/2018 |

* cited by examiner

ORGANIC LIGHT-EMITTING DISPLAY SUBSTRATE AND MANUFACTURING METHOD THEREOF, AND ORGANIC LIGHT-EMITTING DISPLAY DEVICE

CROSS-REFERENCE TO RELATED APPLICATIONS

The present application is a U.S. National Stage Application under 35 U.S.C. § 371 of International Patent Application No. PCT/CN2020/087911, filed on Apr. 29, 2020, the disclosure of which is incorporated by reference herein in its entirety.

TECHNICAL FIELD

The present disclosure relates to an organic light-emitting display substrate and a manufacturing method thereof, and an organic light-emitting display device.

BACKGROUND

Due to a series of excellent characteristics such as self-luminescence, high contrast, wide viewing angle, low power consumption, fast response speed, and low manufacturing cost, the organic light-emitting device as a basis of a new-generation display device, has received more and more attention.

The encapsulation property of the organic light-emitting display substrate is a problem that restricts large-scale application of the organic light-emitting display device.

SUMMARY

According to one aspect of the embodiments of the present disclosure, provided is an organic light-emitting display substrate comprising a display area and a non-display area surrounding the display area, the display area comprising at least one opening penetrating through the organic light-emitting display substrate, the organic light-emitting display substrate comprising: a substrate; an organic layer located on one side of the substrate; a first inorganic layer located on one side of the organic layer away from the substrate, wherein an overall structure of the first inorganic layer and the organic layer has at least one annular partition groove corresponding to each of the at least one opening, the at least one annular partition groove surrounds a periphery of the each of the at least one opening and extends into the organic layer along a direction close to the substrate, and a width of an orthographic projection of a notch of each of the at least one annular partition groove on the substrate is smaller than a width of an orthographic projection of the each of the at least one annular partition groove on the substrate; an anode layer located on one side of the first inorganic layer away from the substrate, and comprising a plurality of anodes and an annular covering portion corresponding to each of the at least one annular partition groove, wherein the annular covering portion at least covers a bottom wall and two side walls of a annular partition groove of the at least one annular partition groove corresponding to the annular covering portion; and an organic functional layer located on one side of the anode layer away from the substrate, and comprising a first organic functional material portion located outside the at least one annular partition groove, and a second organic functional material portion located inside the at least one annular partition groove and not connected to the first organic functional material portion.

In some embodiments, an outer edge of an orthographic projection of the annular covering portion on the substrate is located outside an outer edge of the orthographic projection of the notch of the annular partition groove on the substrate.

In some embodiments, an inner edge of the orthographic projection of the annular covering portion on the substrate is located inside an inner edge of the orthographic projection of the notch of the annular partition groove on the substrate.

In some embodiments, each of the two side walls of the annular partition groove comprises: a first side wall portion extending along a side surface of the first inorganic layer, wherein the notch of the annular partition groove is enclosed by the first side wall portion; a second sidewall portion extending along a surface of the first inorganic layer close to the organic layer and not in contact with a surface of the organic layer; and a third side wall portion extending along a side surface of the organic layer.

In some embodiments, a distance between an outer edge and an inner edge of the orthographic projection of each of the at least one annular partition groove on the substrate is 5 microns to 10 microns.

In some embodiments, a maximum depth of a portion of each of the at least one annular partition groove located in the organic layer is 2 micrometers to 2.5 micrometers.

In some embodiments, an angle between the bottom wall of the annular partition groove and the third side wall portion is 120 degrees to 140 degrees.

In some embodiments, a distance between an outer edge and an inner edge of an orthographic projection of the second side wall portion of the annular partition groove on the substrate is 0.8 micrometer to 1 micrometer.

In some embodiments, the organic layer comprises a first organic layer and a second organic layer sequentially arranged along a direction away from the substrate, and the organic light-emitting display substrate further comprises: a semiconductor layer, a first insulating layer, a first gate metal layer, a second insulating layer, a second gate metal layer, a third insulating layer, a first data metal layer and a second inorganic layer which are located between the substrate and the first organic layer and sequentially arranged along the direction away from the substrate; a second data metal layer located between the first organic layer and the second organic layer; a pixel defining layer and a spacer layer which are located between the anode layer and the organic functional layer and sequentially arranged along the direction away from the substrate; and a cathode layer and an encapsulation layer which are located on one side of the organic functional layer away from the substrate and sequentially arranged along the direction away from the substrate, the cathode layer comprising a first cathode material portion located outside the at least one annular partition groove, and a second cathode material portion located inside the at least one annular partition groove and not connected to the first cathode material portion, wherein the first data metal layer is connected to the semiconductor layer through a plurality of first via holes, and connected to the second data metal layer through a plurality of second via holes, and the second data metal layer is connected to the anode layer through a plurality of third via holes.

In some embodiments, an edge of the organic layer close to an opening of the at least one opening and an edge of the opening are provided with a distance therebetween; and the first inorganic layer comprises a portion surrounding the periphery of the opening and in contact with the second inorganic layer.

In some embodiments, a distance between an edge of the first organic layer close to the opening and the edge of the opening is smaller than a distance between an edge of the second organic layer close to the opening and the edge of the opening.

In some embodiments, the at least one annular partition groove penetrates through the second organic layer and a partial thickness of the first organic layer; or the at least one annular partition groove penetrates through a partial thickness of the second organic layer; or the at least one partition groove penetrates through the second organic layer and the first organic layer.

In some embodiments, a height of one of the two side walls of the annular partition groove which is further away from the at least one opening is greater than a height of the other of the two side walls which is closer to the at least one opening.

In some embodiments, the display area comprises at least one curved portion, each of the at least one curved portion comprising: a plurality of openings; a plurality of island areas, each of the plurality of island areas comprising an organic light-emitting device, a thin film transistor device, a capacitor device and a plurality of electrode structures located at the second data metal layer, and each of the plurality of anodes is connected to one of the plurality of electrode structures through one of the plurality of third via holes; and a bridge area connected to the plurality of island areas and comprising at least one of a plurality of first traces located at the first data metal layer or a plurality of second traces located at the second data metal layer.

In some embodiments, the display area is substantially in a shape of rectangular; and the at least one curved portion comprises four curved portions which are distributed at four corners of the display area.

In some embodiments, the substrate comprises a first organic flexible layer, a second organic flexible layer, and a first inorganic barrier layer located between the first organic flexible layer and the second organic flexible layer.

In some embodiments, the substrate further comprises a second organic flexible layer and an inorganic barrier layer, which are located on one side of the second organic flexible layer away from the first inorganic barrier layer and sequentially arranged along a direction away from the first inorganic barrier layer.

According to another aspect of the embodiments of the present disclosure, provided is an organic light-emitting display device, comprising the organic light-emitting display substrate according to any one of the above embodiments.

According to still another aspect of the embodiments of the present disclosure, provided is a manufacturing method of an organic light-emitting display substrate comprising a display area and a non-display area surrounding the display area, the display area comprising at least one opening penetrating through the organic light-emitting display substrate, the manufacturing method comprising: forming an organic layer on one side of a substrate; forming a first inorganic layer located on one side of the organic layer away from the substrate; etching an overall structure of the first inorganic layer and the organic layer to form at least one annular partition groove corresponding to each of the at least one opening, wherein the at least one annular partition groove surrounds a periphery of the each of the at least one opening and extends into the organic layer along a direction close to the substrate, and a width of an orthographic projection of a notch of each of the at least one annular partition groove on the substrate is smaller than a width of an orthographic projection of the each of the at least one annular partition groove on the substrate; forming an anode layer on one side of the first inorganic layer away from the substrate, wherein the anode layer comprises a plurality of anodes and an annular covering portion corresponding to each of the at least one annular partition groove, wherein the annular covering portion at least covers a bottom wall and two side walls of a annular partition groove of the at least one annular partition groove corresponding to the annular covering portion; and forming an organic functional layer on one side of the anode layer away from the substrate, the organic functional layer comprising a first organic functional material portion located outside the at least one annular partition groove, and a second organic functional material portion located inside the at least one annular partition groove and not connected to the first organic functional material portion.

In some embodiments, an outer edge of an orthographic projection of the annular covering portion on the substrate is located outside an outer edge of the orthographic projection of the notch of the annular partition groove on the substrate; and an inner edge of the orthographic projection of the annular covering portion on the substrate is located inside an inner edge of the orthographic projection of the notch of the annular partition groove on the substrate.

In some embodiments, the organic layer comprises a first organic layer and a second organic layer sequentially arranged along a direction away from the substrate, and the manufacturing method further comprises: forming a semiconductor layer, a first insulating layer, a first gate metal layer, a second insulating layer, a second gate metal layer, a third insulating layer, a first data metal layer and a second inorganic layer sequentially on the one side of the substrate, before forming the first organic layer; forming a second data metal layer on one side of the first organic layer away from the substrate, after forming the first organic layer, and before forming the second organic layer; forming a pixel defining layer and a spacer layer sequentially on the one side of the anode layer away from the substrate, after forming the anode layer, and before forming the organic functional layer; and forming a cathode layer and an encapsulation layer sequentially on one side of the organic functional layer away from the substrate, after forming the organic functional layer, the cathode layer comprising a first cathode material portion located outside the at least one annular partition groove, and a second cathode material portion located inside the at least one annular partition groove and not connected to the first cathode material portion, wherein the first data metal layer is connected to the semiconductor layer through a plurality of first via holes, and connected to the second data metal layer through a plurality of second via holes, and the second data metal layer is connected to the anode layer through a plurality of third via holes.

In some embodiments, the manufacturing method further comprises forming the at least one opening by dry etching, after forming the first inorganic layer.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which:

FIG. 1b is a schematic cross-sectional view at A-A in FIG. 1a;

FIG. 2b is a schematic cross-sectional view at B-B in FIG. 2a;

Figure 1A:
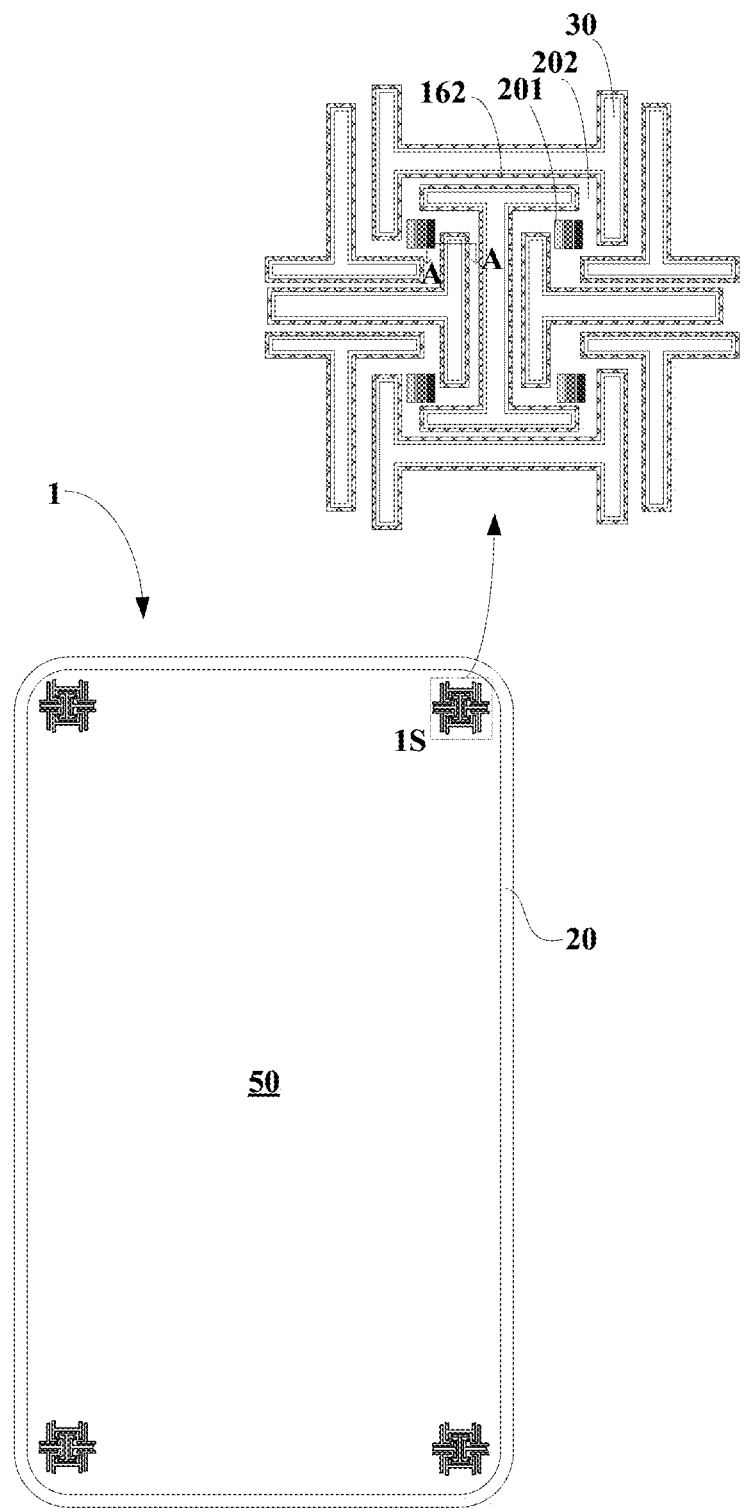
FIG. 1a is a front view of an organic light-emitting display substrate according to an embodiment of the present disclosure.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

With the characteristics of small weight, small thinness and flexibility, the organic light-emitting display substrate is widely applied in a flexible display device. An organic light-emitting display substrate in the related art comprises a plurality of openings, a plurality of island areas, and a bridge area connected to the plurality of island areas. The island area is provided with an organic light-emitting device, and the bridge area is provided with a trace. The organic light-emitting display substrate which uses a flexible substrate supplemented by an opening design, may realize curved display, flexible display or tensile display.

The moisture and oxygen in the air are main factors affecting the service life of the organic light-emitting display substrate. How to prevent the moisture and oxygen from entering an interior of the organic light-emitting display substrate from the openings, improve the encapsulation property of the organic light-emitting display substrate, and prolong the service life of the organic light-emitting display substrate is an urgent technical problem to be solved by those skilled in the art.

In order to solve the above technical problem, the embodiments of the present disclosure provide an organic light-emitting display substrate and a manufacturing method thereof, and an organic light-emitting display device.

Figure 1B:
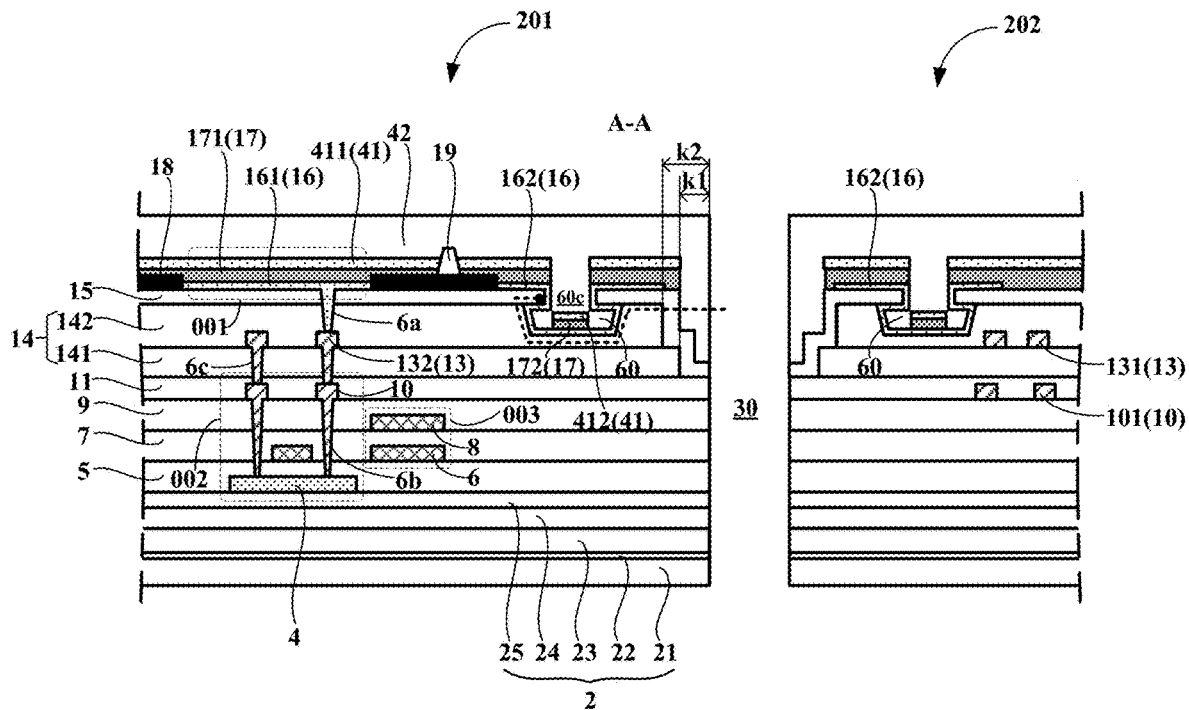
Figure 1C:
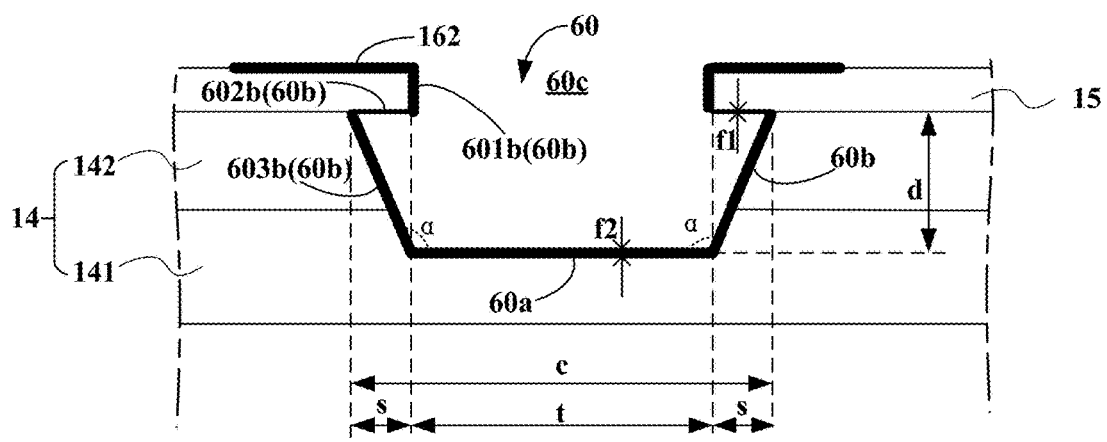
FIG. 1c is a schematic cross-sectional view showing an annular partition groove and an annular covering portion in an embodiment of the present disclosure.

As shown in FIGS. 1a, 1b and 1c, the organic light-emitting display substrate 1 provided by an embodiment of the present disclosure comprises a display area 50 and a non-display area 20 surrounding the display area 50. The display area 50 comprises at least one opening 30 penetrating through the organic light-emitting display substrate 1. The organic light-emitting display substrate 1 comprises a substrate 2, an organic layer 14 located on one side of the substrate 2, a first inorganic layer 15 located on one side of the organic layer 14 away from the substrate 2, an anode layer 16 located on one side of the first inorganic layer 15 away from the substrate 2, and an organic functional layer 17 located on one side of the anode layer 16 away from the substrate 2.

The overall structure of the first inorganic layer 15 and the organic layer 14 has at least one annular partition groove 60 corresponding to each opening 30. The annular partition groove 60 surrounds a periphery of the opening 30 and extends into the organic layer 14 along a direction close to the substrate 2. The width t of the orthographic projection of a notch 60c of the annular partition groove 60 on the substrate 2 is smaller than the width c of the orthographic projection of the annular partition groove 60 on the substrate 2.

The anode layer 16 comprises a plurality of anodes 161 and an annular covering portion 162 corresponding to each annular partition groove 60. The annular covering portion 162 at least covers a bottom wall 60a and two side walls 60b of an annular partition groove 60 corresponding to the annular covering portion 162.

The organic functional layer 17 comprises a first organic functional material portion 171 located outside the annular partition groove 60 and a second organic functional material portion 172 located inside the annular partition groove 60. The first organic functional material portion 171 and the second organic functional material portion 172 are not connected to each other by being partitioned by the annular partition groove 60.

In the embodiments of the present disclosure, the first inorganic layer 15 is located on one side of the organic layer 14 away from the substrate 2. It should be understood that the overall pattern layer of the first inorganic layer 15 is located on one side of the overall pattern layer of the organic layer 14 away from the substrate 2. It should not be understood as an absolute positional relationship of a partial structure. The positional relationship between other pattern layers is similar to this, and thus will not be described in detail here.

The substrate 2 may be a flexible substrate or a rigid substrate. In the embodiments shown in FIGS. 1a and 1b, the substrate 2 is a flexible substrate, and the display area 50 comprises at least one curved portion 1S. Each curved portion 1S comprises a plurality of openings 30, a plurality of island areas 201, and a bridge area 202 connected to the plurality of island areas 201. It should be understood that, the plurality of openings 30 are defined by the plurality of island areas 201 and the bridge area 202. The island area 201 is provided with an organic light-emitting device 001, a thin film transistor device 002 and a capacitor device 003, and the bridge area 202 is provided with a trace. As shown in FIG. 1a, the display area 50 is substantially in a shape of rectangular and comprises four curved portions 1S distributed at four corners of the display area 50. The organic light-emitting display substrate 1 uses a flexible substrate, and the curved portion 1S is designed with openings that penetrate through the organic light-emitting display substrate 1, which make the bent portion 1S more easily be bent, thereby making the organic light-emitting display device present a more prominent curved display effect. It should be understood that the specific patterns of the island area 201, the bridge area 202 and the opening 30 of the curved portion 1S are not limited to those shown.

Figure 2A:
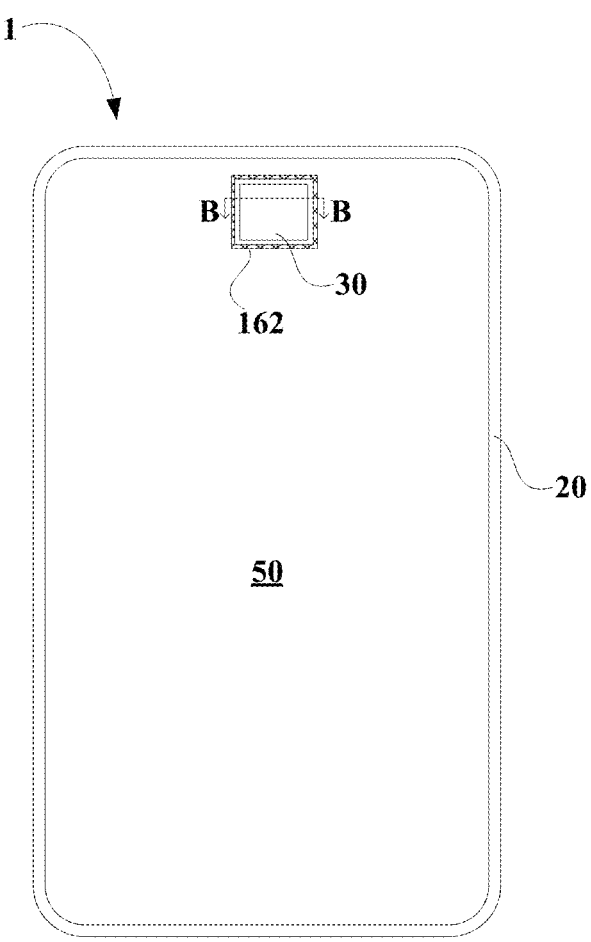
FIG. 2a is a front view of an organic light-emitting display substrate according to another embodiment of the present disclosure.
Figure 2B:
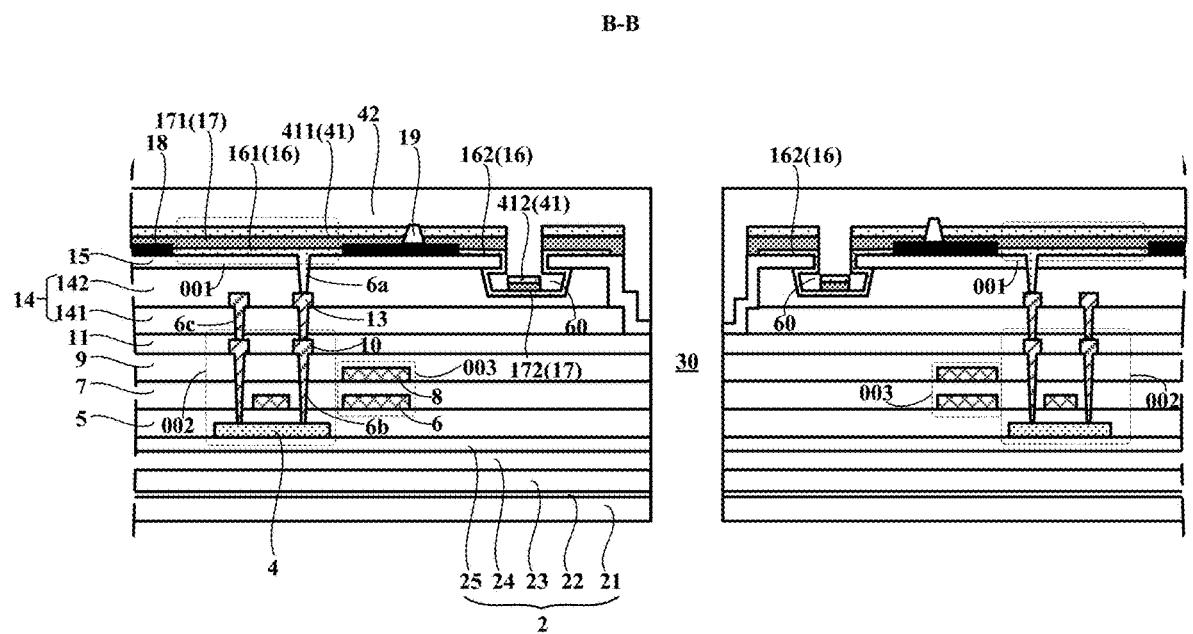

As shown in FIG. 2a, in other embodiments of the present disclosure, the display area 50 comprises one opening 30 that penetrates through the organic light-emitting display substrate 1. The opening 30 is configured to accommodate a functional device such as a camera or sensor of the display device. The shape of the opening 30 is not limited, and for example, is a circle, an ellipse, a rectangle, or a polygon.

In still other embodiments of the present disclosure, the display area may also comprise a plurality of openings penetrating through the organic light-emitting display substrate, a plurality of island areas, and a bridge area connected to the plurality of island areas. The plurality of openings and the plurality of islands areas are substantially evenly distributed in the display area. The island area is provided with an organic light-emitting device, a thin film transistor device and a capacitor device, and the bridge area is provided with a trace. The display device comprising such an organic light-emitting display substrate can realize curved display, flexible display or tensile display.

As shown in FIG. 1b, in some embodiments, the organic layer 14 comprises a first organic layer 141 and a second organic layer 142 that are sequentially arranged along a direction away from the substrate 2. The organic light-emitting display substrate further comprises: a semiconductor layer 4, a first insulating layer 5, a first gate metal layer 6, a second insulating layer 7, a second gate metal layer 8, a third insulating layer 9, a first data metal layer 10, and a second inorganic layer 11 which are located between the substrate 2 and the first organic layer 141 and sequentially arranged along the direction away from the substrate 2; a second data metal layer 13 located between the first organic layer 141 and the second organic layer 142; and a pixel defining layer 18 and a spacer layer 19 which are located between the anode layer 16 and the organic functional layer 17 and sequentially arranged along the direction away from the substrate 2; and a cathode layer 41 and an encapsulation layer 42 which are located on one side of the organic functional layer 17 away from the substrate 2 and sequentially arranged along the direction away from the substrate 2. The cathode layer 41 comprises a first cathode material portion 411 located outside the annular partition groove 60 and a second cathode material portion 412 located inside the annular partition groove 60. The first cathode material portion 411 and the second cathode material portion 412 are not connected to each other by being partitioned by the annular partition groove 60. The first data metal layer 10 is connected to the semiconductor layer 4 through a plurality of first via holes 6b and connected to the second data metal layer 13 through a plurality of second via holes 6c. The second data metal layer 13 is connected to the anode layer 16 through a plurality of third via holes 6a.

As shown in FIG. 1b, in some embodiments of the present disclosure, the annular partition groove 60 penetrates through a partial thickness of the second organic layer 142. As shown in FIG. 1c, in other embodiments of the present disclosure, the annular partition groove 60 penetrates through the second organic layer 142 and a partial thickness of the first organic layer 141. In still other embodiments of the present disclosure, the annular partition groove 60 may also penetrate through the second organic layer and the first organic layer.

The thin film transistor device 002 comprises an active layer located at the semiconductor layer 4, a gate located at the first gate metal layer 6, and a source and drain located at the first data metal layer 10. The source and drain are each connected to the active layer through a first via hole 6b. The capacitor device 003 comprises a first electrode plate located at the first gate metal layer 6 and a second electrode plate located at the second gate metal layer 8. The organic light-emitting device 001 comprises an anode 161, a portion of the organic functional layer 17 directly opposite to the anode 161, and a portion of the cathode layer 41 directly opposite to the anode 161.

As shown in FIG. 1b, the bridge area 202 comprises a plurality of first traces 101 located at the first data metal layer 10 and a plurality of second traces 131 located at the second data metal layer 13. The island area 201 comprises a plurality of electrode structures 132 located at the second data metal layer 13. In the island area 201, the source and drain of the thin film transistor device 002 are each connected to one electrode structure 132 through one second via hole 6c, and the anode 161 of each organic light-emitting device 001 is connected to one electrode structure 132 through one third via hole 6*a*. The organic light-emitting display substrate 1 of this embodiment is designed with a double-layer trace, which is equivalent to connection of resistors in parallel. This may reduce the trace resistance and lower the power consumption of the organic light-emitting display substrate 1.

As shown in FIG. 1*b*, an edge of the organic layer 14 close to the opening 30 and an edge of the opening 30 are provided with a distance k1 therebetween. The first inorganic layer 15 and the second inorganic layer 11 both extend to the edge of the opening 30. The first inorganic layer 15 comprises a portion surrounding the periphery of the opening 30 and in contact with the second inorganic layer 11. That is, the first inorganic layer 15 is in contact with the second inorganic layer at the edge close to the opening 30. Since the organic material has a permeability of moisture and oxygen greater than that of the inorganic material, with the first inorganic layer 15 covering the organic layer 14 near the edge of the opening 30, the probability of moisture and oxygen entering an interior of the substrate from the organic layer 14 is greatly reduced.

In addition, in some embodiments, the distance k1 between an edge of the first organic layer 141 close to the opening 30 and the edge of the opening 30 is smaller than the distance k2 between an edge of the second organic layer 142 close to the opening 30 and the edge of the opening 30. In this way, the first organic layer 141 and the second organic layer 142 form a stepped structure at a location close to the opening 30, which is favorable for improving the thickness uniform of the first inorganic layer 15 close to the opening 30, thereby improving the encapsulation property of the first inorganic layer 15 over the organic layer 14.

As shown in FIG. 1*b*, in some embodiments, the substrate 2 is a flexible substrate comprising a first organic flexible layer 21, a second organic flexible layer 23, and a first inorganic barrier layer 22 located between the first organic flexible layer 21 and the second organic flexible layer 23. The materials of the first organic flexible layer 21 and the second organic flexible layer 23 comprise polyimide, and the material of the first inorganic barrier layer 22 comprises at least one of silicon nitride or silicon oxide. Such a design may not only improve the toughness of the substrate 2, but also facilitate improving the encapsulation property of the organic light-emitting display substrate 1.

As shown in FIG. 1*b*, in some embodiments, the substrate 2 further comprises a second inorganic barrier layer 24 and an inorganic buffer layer 25 located on one side of the second organic flexible layer 23 away from the first inorganic barrier layer 22, and sequentially arranged along a direction away from the first inorganic barrier layer 22. The materials of the second inorganic barrier layer 24 and the inorganic buffer layer 25 comprise at least one of silicon nitride or silicon oxide. The second inorganic barrier layer 24 and the inorganic buffer layer 25 can prevent impurity particles in the organic flexible layers from entering the semiconductor layer 4 to affect the property of the thin film transistor device 002.

In the embodiments of the present disclosure, the organic functional layer 17 comprises a light-emitting layer and at least one of a hole injection layer, an electron injection layer, a hole transport layer, an electron transport layer, an electron blocking layer, or a hole blocking layer. The organic functional layer 17 and the cathode layer 41 of the organic light-emitting display substrate 1 are usually formed by using an evaporation process. The evaporation process means that an evaporation material is heated under a certain vacuum condition to melt or sublime into water vapor constituted by atoms, molecules or atomic groups, which will then condensate on a surface of a substrate to form a film. During the evaporation process, the evaporation material substantially forms a film along a normal direction of the substrate. The organic functional layer and the cathode layer may be formed by evaporation over a large area or formed by patterned evaporation using a mask plate.

As shown in FIG. 1*c*, in the embodiments of the present disclosure, the width t of the orthographic projection of the notch 60*c* of the annular partition groove 60 on the substrate 2 is smaller than the width c of the orthographic projection of the annular partition groove 60 on the substrate 2. That is, the annular partition groove 60 has an undercut structure. In this way, as shown in FIG. 1 *b*, the evaporation material is prevented from continuously forming a film on the side wall 60*b* of the annular partition groove 60, and thus the film is not connected on both sides of the annular partition groove 60. In some embodiments of the present disclosure, as shown in FIG. 1 *b*, the organic functional layer 17 and the cathode layer 41 are formed by evaporation over a large area and not connected on both sides of the annular partition groove 60. After the organic light-emitting display substrate 1 is encapsulated by using a thin film encapsulation technology, since the organic functional layer 17 is not connected on both sides of the annular partition groove 60, which is equivalent to cutting off a passage along which the moisture and oxygen enter an interior of the organic light-emitting display substrate 1 from an edge of the opening along the organic functional layer 17. Therefore, it is possible to effectively improve the encapsulation property and prolong the service life of the organic light-emitting display substrate 1.

The annular partition groove 60 is disposed around the periphery of the opening 30. The number of the annular partition grooves 60 is not limited, for example, may be one, or at least two sequentially arranged along a direction away from the edge of the opening 30.

As mentioned above, with the first inorganic layer 15 covering the organic layer 14, it is possible to greatly reduce the probability of moisture and oxygen entering an interior of the substrate from the organic layer 14. However, the inventors of the present disclosure have found during the process of implementing the embodiments of the present disclosure that, once the first inorganic layer 15 fails to be encapsulated at the edge of the opening 30, for example, broken, it is likely to cause water vapor easily to enter a slit between the first inorganic layer 15 and the organic layer 14.

To solve this problem, in the embodiments of the present disclosure, the anode layer 16 comprises an annular covering portion 162 corresponding to each annular partition groove 60. The annular covering portion 162 at least covers the bottom wall 60*a* and two side walls 60*b* of the annular partition groove 60. As shown in FIG. 1*b*, when the first inorganic layer 15 fails to be encapsulated at the edge of the opening 30, the path the water vapor enters may end at the end of the dotted line shown. This is because the annular covering portion 162 uses the same inorganic material as the anode 161, and the contact surface between the two inorganic materials of the annular covering portion 162 and the first inorganic layer 15 can effectively block the entry of water vapor. Therefore, the structural design of the organic light-emitting display substrate 1 of the embodiments of the present disclosure can effectively prevent the entry of water vapor caused by the failure of the encapsulation of the first inorganic layer 15, thereby prolonging the service life of the organic light-emitting display substrate 1.

The specific material of the anode layer 16 is not limited. In some embodiments, the anode layer 16 comprises a first indium tin oxide layer, a second indium tin oxide layer, and a silver layer sandwiched between the first indium tin oxide layer and the second indium tin oxide layer. The thicknesses of the first indium tin oxide layer and the second indium tin oxide layer are 60 angstroms to 80 angstroms, for example 70 angstroms. The thickness of the silver layer is 800 angstroms to 1200 angstroms, for example 1000 angstroms. For example, the anode layer 16 is formed by patterning a film, by wet etching, which is formed by using a sputtering process.

In some embodiments of the present disclosure, as shown in FIGS. 1b and 1c, the annular covering portion 162 not only covers the bottom wall 60a and the two side walls 60b of the annular partition groove 60, but also covers a part of a surface of the first inorganic layer 15. The outer edge of the orthographic projection of the annular covering portion 162 on the substrate 2 is located outside the outer edge of an orthographic projection of the notch 60c of the annular partition groove 60 on the substrate 2. Such a design makes the design and manufacturing process of the anode layer pattern more convenient and easy to implement on one hand, and increases a contact area of the two inorganic materials of the annular covering portion 162 and the first inorganic layer 15 on one side of the annular partition groove 60 close to the organic light-emitting device 001 on the other hand, thereby further ensuring a blocking effect on water vapor.

In other embodiments of the present disclosure, the outer edge of the orthographic projection of the annular covering portion 162 on the substrate 2 is located outside the outer edge of the orthographic projection of the notch 60c of the annular partition groove 60 on the substrate 2, and the inner edge of the orthographic projection of the annular covering portion 162 on the substrate 2 is located inside the inner edge of the orthographic projection of the notch 60c of the annular partition groove 60 on the substrate 2. This design even further simplifies the design and manufacturing process of the anode layer pattern whilst ensuring the effect blocking on the water vapor, thereby facilitating reducing the manufacturing cost.

As shown in FIG. 1c, in some embodiments of the present disclosure, each of the two side walls 60b of the annular partition groove 60 comprises a first side wall portion 601b extending along a side surface of the first inorganic layer 15 (i.e., a section formed by etching the first inorganic layer 15), wherein the notch 60c of the annular partition groove 60 is enclosed by the first side wall portion 601b; a second sidewall portion 602b extending along a surface of the first inorganic layer 15 close to the organic layer 14 and not in contact with a surface of the organic layer 14; and a third sidewall portion 603b extending along a side surface of the organic layer 14 (i.e., a section formed by etching the organic layer 14). Since the materials of the first inorganic layer 15 and the organic layer 14 are quite different, an appropriate selection ratio may be selected to dry etch the first inorganic layer 15 and the organic layer 14 to form an undercut-like structure as shown on one side of the first inorganic layer 15 close to the organic layer 14. Due to the structural characteristics of the annular partition groove 60, the thickness f1 of a part of the annular covering portion 162, which is formed by wet etching a film formed by using a sputtering process, in contact with the surface of the first inorganic layer 15 close to the organic layer 14 is slightly smaller than the thickness f2 of the other part of the annular covering portion 162.

In some embodiments, the width c of the orthographic projection of the annular partition groove 60 on the substrate 2, that is, the distance c between the outer edge and the inner edge of the orthographic projection of the annular partition groove 60 on the substrate 2, is 5 microns to 10 microns. The maximum depth d of a portion of the annular partition groove 60 located in the organic layer 14 is 2 microns to 2.5 microns. The angle α between the bottom wall 60a of the annular partition groove 60 and any one third side wall portion 603b is 120° to 140°. The distance s between the outer edge and the inner edge of the orthographic projection of any one second side wall portion 602b of the annular partition groove 60 on the substrate 2 is 0.8 micron to 1 micron.

Figure 1D:
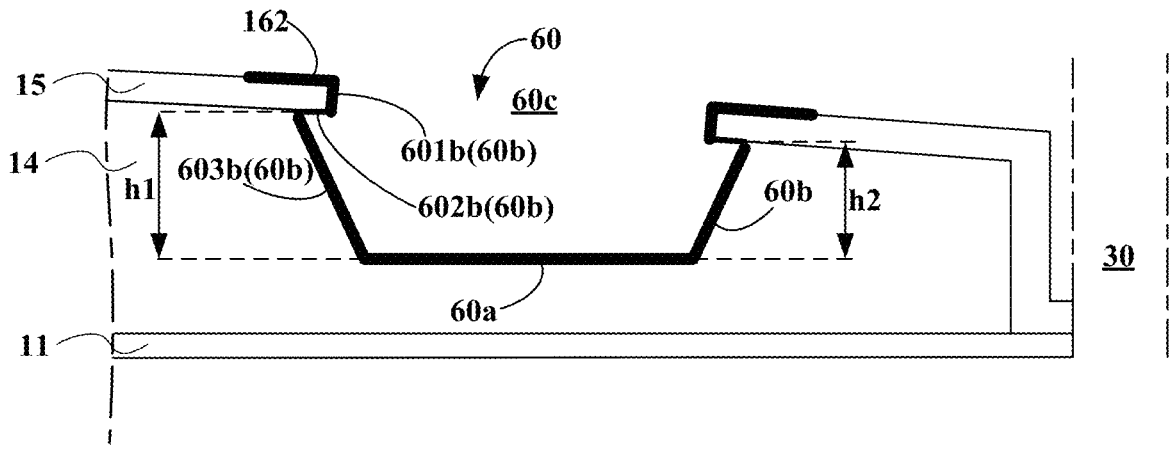
FIG. 1d is a schematic cross-sectional view showing an annular partition groove and an annular covering portion in another embodiment of the present disclosure.

The heights of the two side walls 60b of the annular partition groove 60 may be the same or different, which is related to a thickness change of the organic layer 14. As shown in FIG. 1d, in some embodiments of the present disclosure, after the manufacture of the organic layer 14 is completed, the thickness of the organic layer 14 in the vicinity of the opening 30 gradually becomes thinner. Among the two side walls 60b of the annular partition groove 60, the height h1 of the side wall 60b which is further away from the opening 30 is greater than the height h2 of the side wall 60b which is closer to the opening 30.

Figure 3:
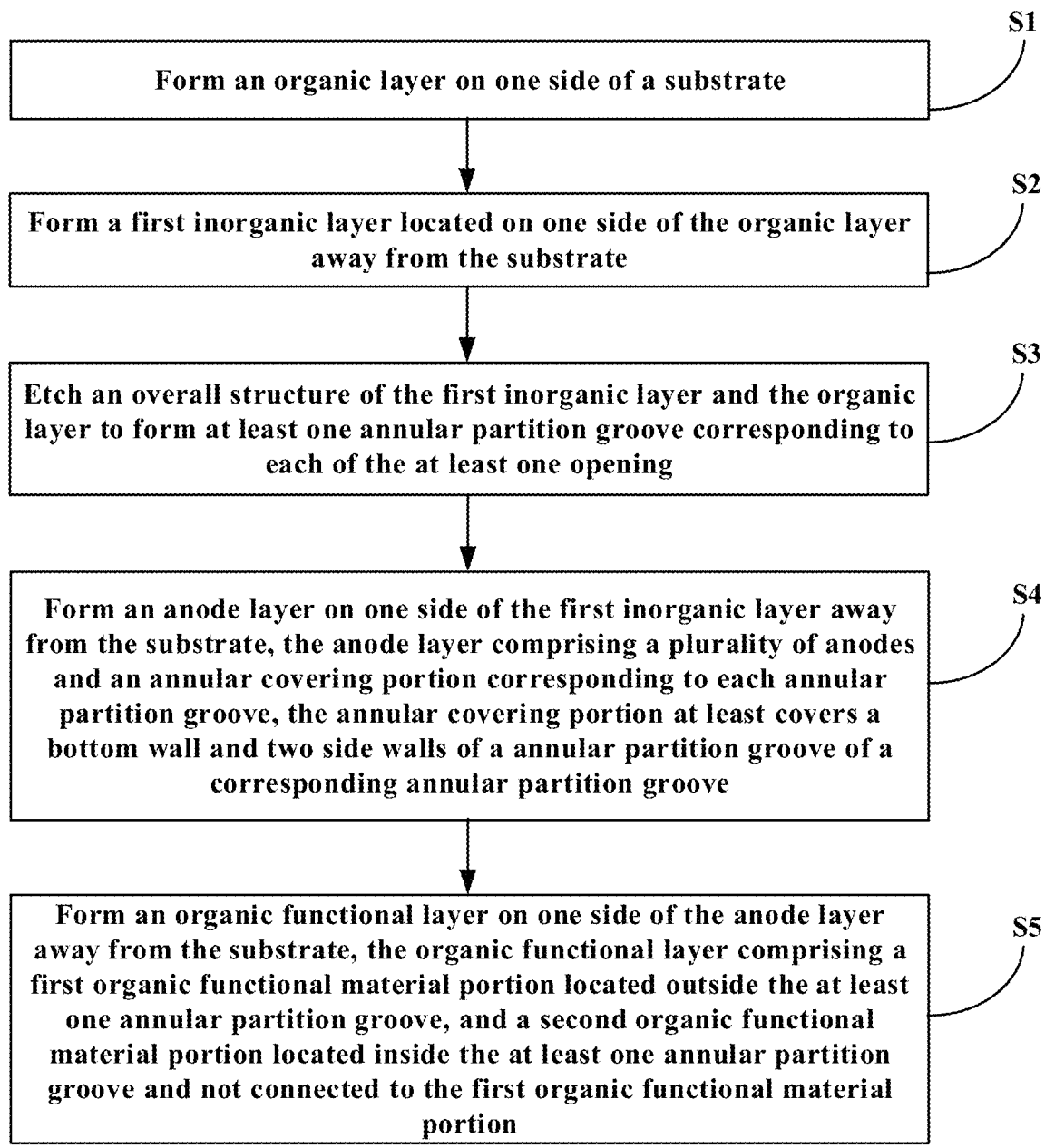
FIG. 3 is a flowchart showing a manufacturing method of an organic light-emitting display substrate according to an embodiment of the present disclosure.
Figure 4:
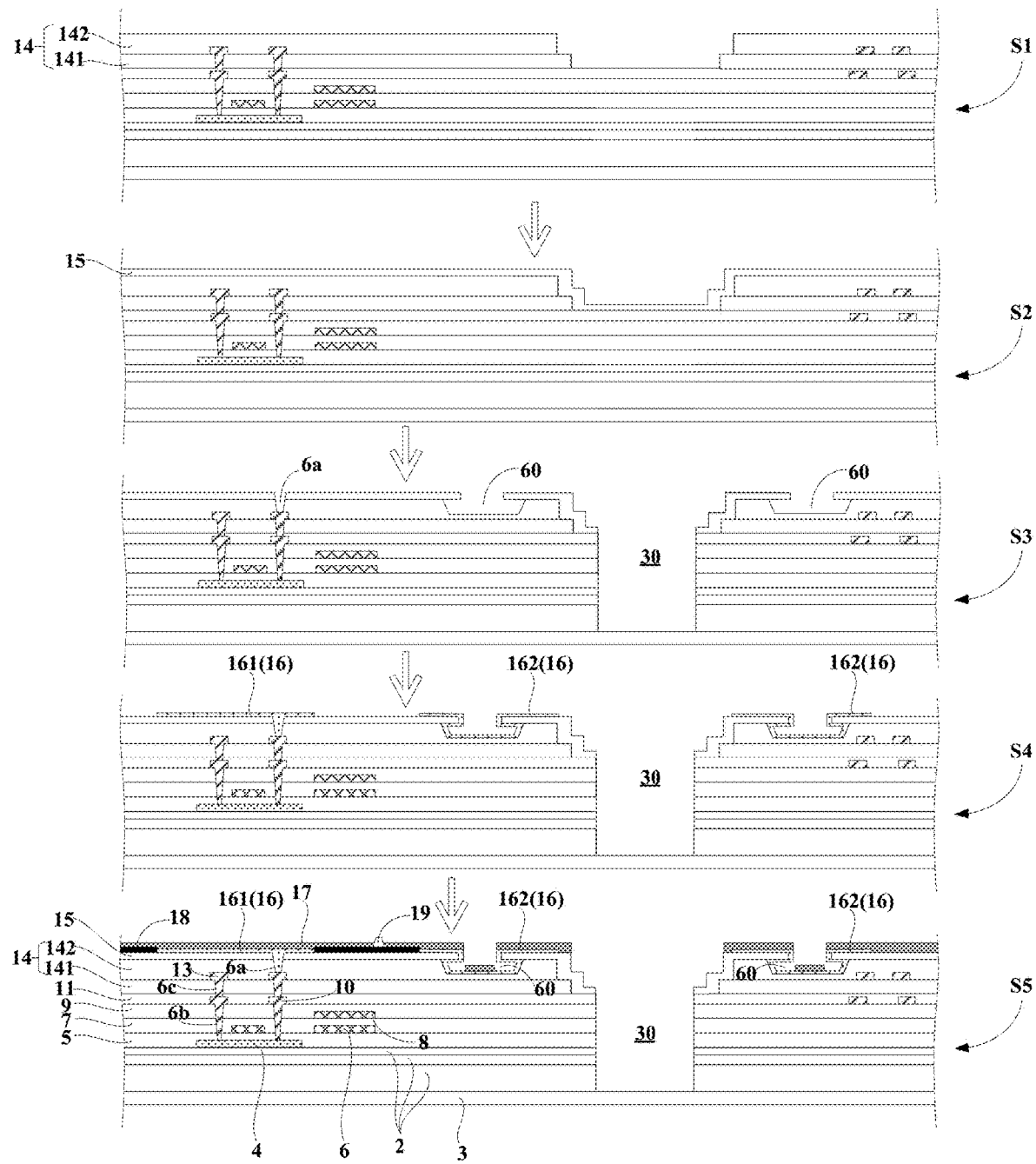
FIG. 4 shows some schematic cross-sectional views showing an organic light-emitting display substrate during a manufacturing process according to an embodiment of the present disclosure.

As shown in FIGS. 3 and 4, the embodiments of the present disclosure also provide a manufacturing method of an organic light-emitting display substrate comprising a display area and a non-display area surrounding the display area. The display area comprises at least one opening 30 penetrating through the organic light-emitting display substrate. The manufacturing method of the organic light-emitting display substrate comprises the following steps S1 to S5.

At step S1, an organic layer 14 is formed on one side of the substrate 2.

In some embodiments, the organic layer 14 comprises a first organic layer 141 and a second organic layer 142 sequentially arranged along a direction away from the substrate 2.

In an embodiment of the present disclosure, the substrate 2 is a flexible substrate and pre-formed on a glass substrate 3. The glass substrate 3 plays a supporting role during the manufacturing process of the organic light-emitting display substrate. After the manufacture of the structure of the organic light-emitting display substrate is completed, the glass substrate 3 is peeled off the substrate 2 to support the flexible property of the organic light-emitting display substrate.

At step S2, a first inorganic layer 15 is formed on one side of the organic layer 14 away from the substrate 2.

At step S3, an overall structure of the first inorganic layer 15 and the organic layer 14 is etched to form at least one annular partition groove 60 corresponding to each opening 30. The annular partition groove 60 surrounds a periphery of the opening 30 and extends into the organic layer 14 along a direction close to the substrate 2. The width of the orthographic projection the notch of the annular partition groove 60 on the substrate 2 is smaller than the width of the orthographic projection of the annular partition groove 60 on the substrate 2.

Since the materials of the first inorganic layer 15 and the organic layer 14 are quite different, an appropriate selection ratio may be selected to dry etch the first inorganic layer 15 and the organic layer 14 to form an undercut-like structure of the annular partition groove 60. That is, the width of the orthographic projection the notch of the annular partition groove 60 on the substrate 2 is smaller than the width of the orthographic projection of the annular partition groove 60 on the substrate 2.

At step S4, an anode layer 16 is formed on one side of the first inorganic layer 15 away from the substrate 2. The anode layer 16 comprises a plurality of anodes 161 and an annular covering portion 162 corresponding to each annular partition groove 60. The annular covering portion 162 at least covers a bottom wall and two side walls of a corresponding annular partition groove 60.

At step S5, an organic functional layer 17 is formed on one side of the anode layer 16 away from the substrate 2. As shown in FIG. 1b, the organic functional layer 17 comprises a first organic functional material portion 171 located outside the annular partition groove 60 and a second organic functional material portion 172 located inside the annular partition groove 60. The first organic functional material portion 171 and the second organic functional material portion 172 are not connected to each other by being partitioned by the annular partition groove 60.

In some embodiments of the present disclosure, at step S5, the outer edge of the orthographic projection of the formed annular covering portion 162 on the substrate 2 is located outside the outer edge of the orthographic projection of the notch of the annular partition groove 60 on the substrate 2, and the inner edge of the orthographic projection of the formed annular covering portion 162 on the substrate 2 is located inside the inner edge of the orthographic projection of the notch of the annular partition groove 60 on the substrate 2.

In some embodiments of the present disclosure, the organic layer 14 comprises a first organic layer 141 and a second organic layer 142 sequentially arranged along a direction away from the substrate 2. The manufacturing method of the organic light-emitting display substrate further comprises following steps.

A semiconductor layer 4, a first insulating layer 5, a first gate metal layer 6, a second insulating layer 7, a second gate metal layer 8, a third insulating layer 9, a first data metal layer 10, and a second inorganic layer 11 are sequentially formed on one side of the substrate 2, before the first organic layer 141 is formed.

A second data metal layer 13 is formed on one side of the first organic layer 141 away from the substrate 2, after the first organic layer 141 is formed and before the second organic layer 142 is formed.

A pixel defining layer 18 and a spacer layer 19 are sequentially formed on one side of the anode layer 16 away from the substrate 2, after the anode layer 16 is formed and before the organic functional layer 17 is formed.

A cathode layer 41 and an encapsulation layer 42 are sequentially formed on one side of the organic functional layer 17 away from the substrate 2, after the organic functional layer is formed. The cathode layer 41 comprises a first cathode material portion 411 located outside the annular partition groove 60 and a second cathode material portion 412 located inside the annular partition groove 60. The first cathode material portion 411 and the second cathode material portion 412 are not connected to each other by being partitioned by the annular partition groove 60.

The first data metal layer 10 is connected to the semiconductor layer 4 through a plurality of first via holes 6b, and connected to the second data metal layer 13 through a plurality of second via holes 6c, and the second data metal layer 13 is connected to the anode layer 16 through a plurality of third via holes 6a. In an embodiment of the present disclosure, after the step S2, before the step S3 or during the step S3, the overall structure of the first inorganic layer 15 and the organic layer 14 is etched to form the plurality of third via holes 6a opening extending to the second data metal layer 13.

In some embodiments of the present disclosure, the manufacturing method of the organic light-emitting display substrate further comprises the following step. The opening 30 is formed by dry etching after the first inorganic layer 15 is formed. This step may be performed after the step S3 and before the step S4, or performed after the manufacture of the cathode layer 41 or the encapsulation layer 42 is completed.

In the organic light-emitting display substrate manufactured by the above method of the present disclosure, when the first inorganic layer 15 fails to be encapsulated at an edge of the opening 30, the entry path of water vapor will end at a contact surface of the two inorganic materials of the annular covering portion 162 and the first inorganic layer 15. Therefore, the organic light-emitting display substrate has a favorable encapsulation property.

Figure 5:
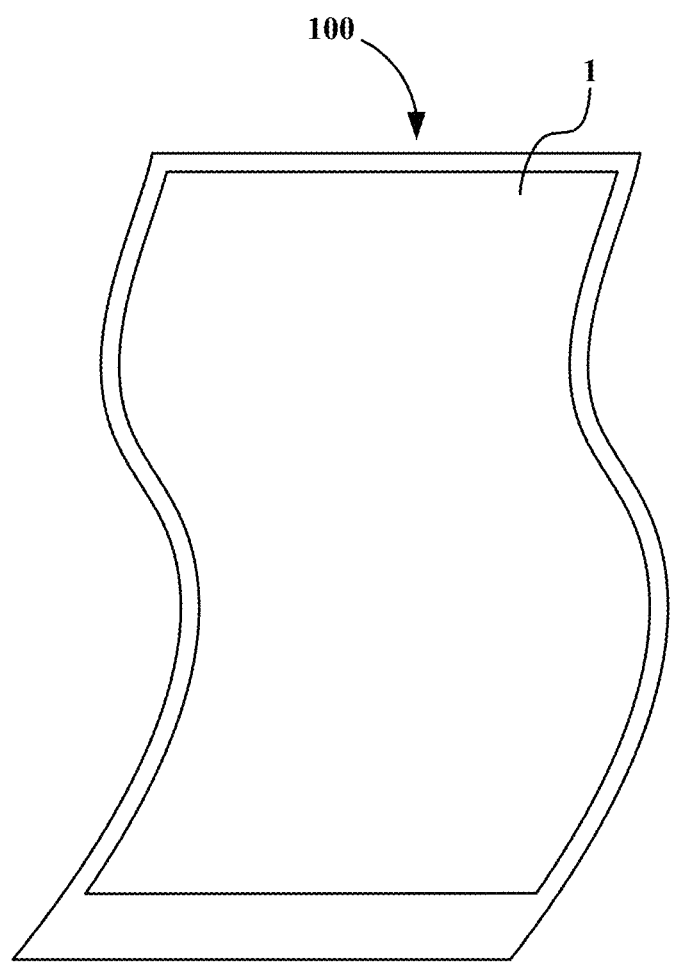
FIG. 5 is a schematic view showing an organic light-emitting display device according to an embodiment of the present disclosure.

As shown in FIG. 5, the embodiments of the present disclosure also provide an organic light-emitting display device 100 comprising the organic light-emitting display substrate 1 of any one of the above embodiments. In the embodiments of the present disclosure, the organic light-emitting display device may be a curved display device, a flexible display device, or a tensile display device. The organic light-emitting display device is not limited to a specific product type, for example, may be a mobile phone, a tablet computer, a display, a television, a painting screen, an advertising screen, an electronic paper, a smart wearable, an in-vehicle navigation, or the like.

Since the organic light-emitting display substrate has a favorable encapsulation property and a longer service life, the organic light-emitting display device also has a favorable product quality.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. An organic light-emitting display substrate, comprising a display area and a non-display area surrounding the display area, the display area comprising at least one opening penetrating through the organic light-emitting display substrate, the organic light-emitting display substrate comprising:

a substrate;
an organic layer located on one side of the substrate;
a first inorganic layer located on one side of the organic layer away from the substrate, wherein an overall structure of the first inorganic layer and the organic layer has at least one annular partition groove corresponding to each of the at least one opening, the at least one annular partition groove surrounds a periphery of the each of the at least one opening and extends into the organic layer towards the substrate, and a width of an orthographic projection of a notch of each of the at least one annular partition groove on the substrate is smaller than a width of an orthographic projection of the each of the at least one annular partition groove on the substrate;

an anode layer located on one side of the first inorganic layer away from the substrate, and comprising a plurality of anodes and an annular covering portion corresponding to each of the at least one annular partition groove, wherein the annular covering portion at least covers a bottom wall and two side walls of an annular partition groove of the at least one annular partition groove corresponding to the annular covering portion, and a material of the annular covering portion is the same as materials of the plurality of anodes; and an organic functional layer located on one side of the anode layer away from the substrate, and comprising a first organic functional material portion located outside the at least one annular partition groove, and a second organic functional material portion located inside the at least one annular partition groove and not connected to the first organic functional material portion.

2. The organic light-emitting display substrate according to claim 1, wherein an outer edge of an orthographic projection of the annular covering portion on the substrate is located outside an outer edge of the orthographic projection of the notch of the annular partition groove on the substrate.

3. The organic light-emitting display substrate according to claim 2, wherein an inner edge of the orthographic projection of the annular covering portion on the substrate is located inside an inner edge of the orthographic projection of the notch of the annular partition groove on the substrate.

4. The organic light-emitting display substrate according to claim 1, wherein each of the two side walls of the annular partition groove comprises:
   a first side wall portion extending along a side surface of the first inorganic layer, wherein the notch of the annular partition groove is enclosed by the first side wall portion;
   a second sidewall portion extending along a surface of the first inorganic layer close to the organic layer and not in contact with a surface of the organic layer; and
   a third side wall portion extending along a side surface of the organic layer.

5. An organic light-emitting display substrate, comprising a display area and a non-display area surrounding the display area, the display area comprising at least one opening penetrating through the organic light-emitting display substrate, the organic light-emitting display substrate comprising:
   a substrate;
   an organic layer located on one side of the substrate;
   a first inorganic layer located on one side of the organic layer away from the substrate, wherein an overall structure of the first inorganic layer and the organic layer has at least one annular partition groove corresponding to each of the at least one opening, the at least one annular partition groove surrounds a periphery of the each of the at least one opening and extends into the organic layer towards the substrate, and a width of an orthographic projection of a notch of each of the at least one annular partition groove on the substrate is smaller than a width of an orthographic projection of the each of the at least one annular partition groove on the substrate;

an anode layer located on one side of the first inorganic layer away from the substrate, and comprising a plurality of anodes and an annular covering portion corresponding to each of the at least one annular partition groove, wherein the annular covering portion at least covers a bottom wall and two side walls of an annular partition groove of the at least one annular partition groove corresponding to the annular covering portion; and an organic functional layer located on one side of the anode layer away from the substrate, and comprising a first organic functional material portion located outside the at least one annular partition groove, and a second organic functional material portion located inside the at least one annular partition groove and not connected to the first organic functional material portion, wherein a distance between an outer edge and an inner edge of the orthographic projection of each of the at least one annular partition groove on the substrate is 5 microns to 10 microns.

6. The organic light-emitting display substrate according to claim 4, wherein a maximum depth of a portion of each of the at least one annular partition groove located in the organic layer is 2 micrometers to 2.5 micrometers.

7. The organic light-emitting display substrate according to claim 4, wherein an angle between the bottom wall of the annular partition groove and the third side wall portion is 120 degrees to 140 degrees.

8. The organic light-emitting display substrate according to claim 4, wherein a distance between an outer edge and an inner edge of an orthographic projection of the second side wall portion of the annular partition groove on the substrate is 0.8 micrometer to 1 micrometer.

9. The organic light-emitting display substrate according to claim 4, wherein the organic layer comprises a first organic layer and a second organic layer sequentially arranged along a direction away from the substrate, and the organic light-emitting display substrate further comprises:
   a semiconductor layer, a first insulating layer, a first gate metal layer, a second insulating layer, a second gate metal layer, a third insulating layer, a first data metal layer and a second inorganic layer which are located between the substrate and the first organic layer and sequentially arranged along the direction away from the substrate;
   a second data metal layer located between the first organic layer and the second organic layer;
   a pixel defining layer and a spacer layer which are located between the anode layer and the organic functional layer and sequentially arranged along the direction away from the substrate; and
   a cathode layer and an encapsulation layer which are located on one side of the organic functional layer away from the substrate and sequentially arranged along the direction away from the substrate, the cathode layer comprising a first cathode material portion located outside the at least one annular partition groove, and a second cathode material portion located inside the at least one annular partition groove and not connected to the first cathode material portion, wherein the first data metal layer is connected to the semiconductor layer through a plurality of first via holes, and connected to the second data metal layer through a plurality of second via holes, and the second data metal layer is connected to the anode layer through a plurality of third via holes.

10. The organic light-emitting display substrate according to claim 9, wherein:
an edge of the organic layer close to an opening of the at least one opening and an edge of the opening are provided with a distance therebetween; and
the first inorganic layer comprises a portion surrounding the periphery of the opening and in contact with the second inorganic layer.

11. The organic light-emitting display substrate according to claim 10, wherein a distance between an edge of the first organic layer close to the opening and the edge of the opening is smaller than a distance between an edge of the second organic layer close to the opening and the edge of the opening.

12. The organic light-emitting display substrate according to claim 9, wherein the at least one annular partition groove penetrates through the second organic layer and extends into the first organic layer; or the at least one annular partition groove extends into the second organic layer; or the at least one partition groove penetrates through the second organic layer and the first organic layer.

13. The organic light-emitting display substrate according to claim 9, wherein a height of one of the two side walls of the annular partition groove which is further away from the at least one opening is greater than a height of the other of the two side walls which is closer to the at least one opening.

14. The organic light-emitting display substrate according to claim 9, wherein the display area comprises at least one curved portion, each of the at least one curved portion comprising:
a plurality of openings;
a plurality of island areas, each of the plurality of island areas comprising an organic light-emitting device, a thin film transistor device, a capacitor device and a plurality of electrode structures located at the second data metal layer, and each of the plurality of anodes is connected to one of the plurality of electrode structures through one of the plurality of third via holes; and
a bridge area connected to the plurality of island areas and comprising at least one of a plurality of first traces located at the first data metal layer or a plurality of second traces located at the second data metal layer.

15. The organic light-emitting display substrate according to claim 14, wherein:
the display area is substantially in a shape of rectangular; and
the at least one curved portion comprises four curved portions which are distributed at four corners of the display area.

16. The organic light-emitting display substrate according to claim 1, wherein the substrate comprises a first organic flexible layer, a second organic flexible layer, and a first inorganic barrier layer located between the first organic flexible layer and the second organic flexible layer, wherein the first organic flexible layer and the second organic flexible layer are bendable.

17. The organic light-emitting display substrate according to claim 16, wherein the substrate further comprises a second organic flexible layer and an inorganic barrier layer, which are located on one side of the second organic flexible layer away from the first inorganic barrier layer and sequentially arranged along a direction away from the first inorganic barrier layer.

18. An organic light-emitting display device, comprising the organic light-emitting display substrate according to claim 1.

19. A manufacturing method of an organic light-emitting display substrate comprising a display area and a non-display area surrounding the display area, the display area comprising at least one opening penetrating through the organic light-emitting display substrate, the manufacturing method comprising:
forming an organic layer on one side of a substrate;
forming a first inorganic layer located on one side of the organic layer away from the substrate;
etching an overall structure of the first inorganic layer and the organic layer to form at least one annular partition groove corresponding to each of the at least one opening, wherein the at least one annular partition groove surrounds a periphery of the each of the at least one opening and extends into the organic layer towards the substrate, and a width of an orthographic projection of a notch of each of the at least one annular partition groove on the substrate is smaller than a width of an orthographic projection of the each of the at least one annular partition groove on the substrate;
forming an anode layer on one side of the first inorganic layer away from the substrate, wherein the anode layer comprises a plurality of anodes and an annular covering portion corresponding to each of the at least one annular partition groove, wherein the annular covering portion at least covers a bottom wall and two side walls of an annular partition groove of the at least one annular partition groove corresponding to the annular covering portion, and a material of the annular covering portion is the same as materials of the plurality of anodes; and
forming an organic functional layer on one side of the anode layer away from the substrate, the organic functional layer comprising a first organic functional material portion located outside the at least one annular partition groove, and a second organic functional material portion located inside the at least one annular partition groove and not connected to the first organic functional material portion.

20. The method according to claim 19, wherein:
an outer edge of an orthographic projection of the annular covering portion on the substrate is located outside an outer edge of the orthographic projection of the notch of the annular partition groove on the substrate; and
an inner edge of the orthographic projection of the annular covering portion on the substrate is located inside an inner edge of the orthographic projection of the notch of the annular partition groove on the substrate.

* * * * *